US009183825B2

United States Patent
Maeda

(10) Patent No.: US 9,183,825 B2
(45) Date of Patent: Nov. 10, 2015

(54) NOISE REDUCTION APPARATUS

(71) Applicant: Panasonic Corporation, Osaka (JP)

(72) Inventor: Tsuyoshi Maeda, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 483 days.

(21) Appl. No.: 13/724,467

(22) Filed: Dec. 21, 2012

(65) Prior Publication Data

US 2013/0163774 A1     Jun. 27, 2013

(30) Foreign Application Priority Data

Dec. 22, 2011   (JP) ................. 2011-280928

(51) Int. Cl.
*G10K 11/16*       (2006.01)
*G10K 11/00*       (2006.01)
*G10K 11/178*      (2006.01)

(52) U.S. Cl.
CPC ............ *G10K 11/002* (2013.01); *G10K 11/178* (2013.01); *G10K 2210/1281* (2013.01); *G10K 2210/3031* (2013.01); *G10K 2210/3214* (2013.01); *G10K 2210/3221* (2013.01); *G10K 2210/3226* (2013.01); *G10K 2210/503* (2013.01); *H03B 2200/0088* (2013.01)

(58) Field of Classification Search
CPC ............ H04R 1/1083; H04R 2410/05; H04R 2460/01; H04R 2410/01; G10K 11/002; H03B 2200/0088
USPC ............ 381/71.1–71.4, 71.6, 71.11, 72, 73.1, 381/94.1
See application file for complete search history.

(56) References Cited

U.S. PATENT DOCUMENTS

| | | | | |
|---|---|---|---|---|
| 6,343,127 | B1 * | 1/2002 | Billoud | 381/71.4 |
| 8,611,553 | B2 * | 12/2013 | Bakalos et al. | 381/72 |
| 9,020,158 | B2 * | 4/2015 | Wertz et al. | 381/71.11 |
| 2010/0027804 | A1 * | 2/2010 | Kano | 381/71.11 |

FOREIGN PATENT DOCUMENTS

| | | |
|---|---|---|
| JP | 1-270489 | 10/1989 |
| JP | 6-14009 | 4/1994 |
| JP | 9-55995 | 2/1997 |
| JP | 2008-216375 | 9/2008 |
| JP | 2010-76715 | 4/2010 |

\* cited by examiner

*Primary Examiner* — Md S Elahee
(74) *Attorney, Agent, or Firm* — Wenderoth, Lind & Ponack, L.L.P.

(57) ABSTRACT

The noise reduction apparatus according to the present disclosure includes a plurality of loudspeakers, control sound signal generating units, and a plurality of error microphones. Each of the control sound signal generating units generates control sound signal based on the error sound detected by a corresponding error microphone of the plurality of error microphones. The noise reduction apparatus further including an input switching unit that, when a level of the noise at a predetermined position is higher than the predetermined threshold value, feeds an error audio signal at a predetermined control point of the plurality of control points or a control point that is newly set based on the plurality of control points into each of the control sound signal generating units, the number of the newly set control point being less than the number of the plurality of control points.

8 Claims, 7 Drawing Sheets

NOISE REDUCTION APPARATUS

BACKGROUND

1. Technical Field

The disclosure relates to a noise reduction apparatus that reduces noise.

2. Related Art

JPA-1-270489 discloses a noise reduction apparatus. The noise reduction apparatus includes a microphone that receives noise generated from a noise source and converts the noise into an electric signal, an audio regulating unit that amplifies the electric signal received from the microphone and inverts a phase of the electric signal, and a loudspeaker that converts the electric signal input from the audio regulating unit into a sound to emit the sound. Since the phase of the sound from the loudspeaker and the phase of the sound from the sound source are different from each other by 180 degrees, a silent part can be formed in a sound field.

SUMMARY

When a noise level is high, the noise level exceeds the reproducing capability of the loudspeaker, and a noise reduction effect may be deteriorated.

The disclosure provides a noise reduction apparatus that can reduce noise regardless of noise levels.

The noise reduction apparatus according to the present disclosure includes:

a plurality of loudspeakers that generate control sounds to cancel noises at a plurality of control points at which noise are reduced;

a plurality of control sound signal generating units, each of the control sound signal generating units being provided so as to correspond to each of the plurality of loudspeakers and generating control sound signal to drive the corresponding loudspeaker of the plurality of loudspeakers; and a plurality of error microphones, each of the error microphones is arranged at a corresponding control point of the plurality of control points and detecting error sound between the noise at the corresponding control point and the control sound at the corresponding control point, wherein each of the control sound signal generating units generates control sound signal based on the error sound detected by a predetermined error microphone of the plurality of error microphones, and the noise reduction apparatus further comprising an input switching unit that, when a level of the noise at a predetermined position is higher than the predetermined threshold value, feeds an error audio signal at a predetermined control point of the plurality of control points or a control point that is newly set based on the plurality of control points to each of the control sound signal generating units, the number of the newly set control point being less than the number of the plurality of control points.

The noise reduction apparatus according to the disclosure can reduce noise at a control point regardless of noise levels.

DETAILED DESCRIPTION OF PREFERRED EMBODIMENT

Figure 1:
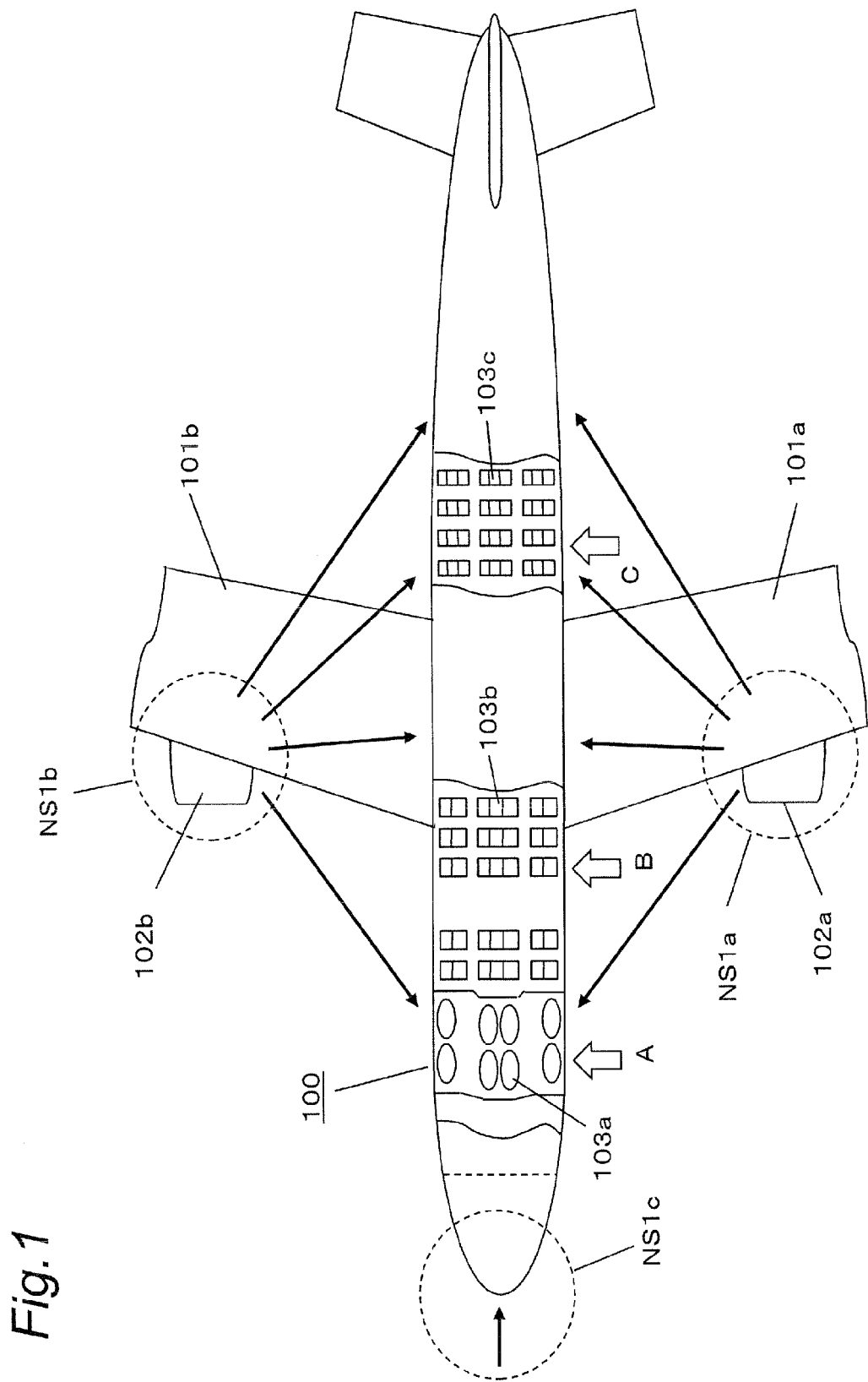
FIG. 1 is a diagram showing an installation environment of a noise reduction apparatus according to Embodiment 1.

Embodiments will be described below in detail with reference to the accompanying drawings. However, an excessively detailed explanation may be omitted. For example, detailed explanations of already well-known items and duplicate explanation for substantially the same configurations may be omitted. This is to avoid the following explanations from being unnecessarily redundant and to make it easy that persons skilled in the art understand the art.

The present inventor provides the accompanying drawings and the following explanations to cause persons skilled in the art to sufficiently understand the disclosure and do not intend to limit the primary theme described in the scope of claims by the drawings and the explanations.

DEVELOPMENT OF THE INVENTION

In an airplane, a vehicle, or the like that generates loud noise, when an information service such as voice service is provided to a user sit on a seat, noise at the seat causes an issue. An internal space of which the boundary is formed by a continuous wall like an airplane or a vehicle has an enclosed structure. When a noise source is present in the internal space, a noise environment is fixed for a user. For this reason, depending on the degree of noise, the noise makes factors of physical and mental stresses on a user and deteriorates convenience for the user.

In particular, when a service is provided to users in a passenger room of an airplane or the like, the deterioration of convenience poses a serious problem for the quality of a service trade. In particular, in an airplane, noise caused by machines such as propellers, engines, and the like that generate an impelling force of the airplane and a sound related to an airflow generated with movement of an air frame in an airspace such as wind noise generated by the front edge or both the airfoils of the flying airplane become main noise sources. Since the noise in the airplane makes passengers uncomfortable and hinders a voice service or the like, noise is strongly required to be reduced.

As a countermeasure to reduce noise in an enclosed space, a conventional method using passive attenuating means is generally used, and a noise insulating material such as a barrier material or an absorbent material having acoustic absorbency is arranged between an enclosed structure and a noise source. As the barrier material, a high-density barrier material or the like is used, and an absorption sheet or the like is used as the absorbent material. A material having acoustic absorbency is generally high-density, and a high-density material causes an increase in weight. When the weight increases, an aviation fuel increases, and a cruising distance becomes short. Thus, the economical efficiency and functions of the airplane are deteriorated. In a structure material, deterioration of functions in terms of strength and design such as fragility or texture cannot be neglected.

As a method of coping with a problem of a countermeasure against noise by the passive attenuating means, for example, a method of reducing noise by active attenuating means as described in the Patent Document 1 is known. According to the method, an acoustic wave having a phase opposite of the phase of noise is generated. According to this method, a noise level at a noise source or near the noise source is reduced to make it possible to prevent the noise from being propagated to a region in which noise must be reduced. As the method, for example, the method described in the Patent Document 1 is given.

However, when a noise level is high, the noise level exceeds the reproducing capability of the loudspeaker, and a noise reduction effect may be deteriorated.

The disclosure provides a noise reduction apparatus that can effectively reduce noise regardless of noise levels. The noise reduction apparatus will be described in detail below.

Embodiment 1

A case in which a noise reduction apparatus according to Embodiment 1 is mounted on an airplane will be described below.

1. Acoustic Environment in Airplane

FIG. 1 is a plan view for explaining an acoustic environment in an airplane to which the noise reduction apparatus according to Embodiment 1 is applied. As shown in FIG. 1, an airplane 100 has engines 102a and 102b on left and right airfoils 101a and 101b and. Since the engines 102a and 102b generate a rotation sound, the engines act as noise sources NS1a and NS1b. Noise generated from the NS1a and NS1b is transmitted to parts of an air frame such as rows of seats 103a, 103b, and 103c arranged in a passenger room A (for example, a first-class section), a passenger room B (for example, a business-class section), and passenger room C (for example, an economy-class section) in the airplane. When the air frame moves in an airspace at a high speed, an airflow is generated at the front edge of the air frame. The airflow acts as a noise source NS1c because the airflow generates wind noise. Noise caused by the noise sources NS1a, NS1b, and NS1c adversely affect an information providing service or the like in an airplane. The noise reduction apparatus according to the disclosure is installed at each seat configuring the rows of seats 103a, 103b, and 103c to perform a noise reduction operation such that noise makes a user uncomfortable.

2. Configuration

Figure 2:
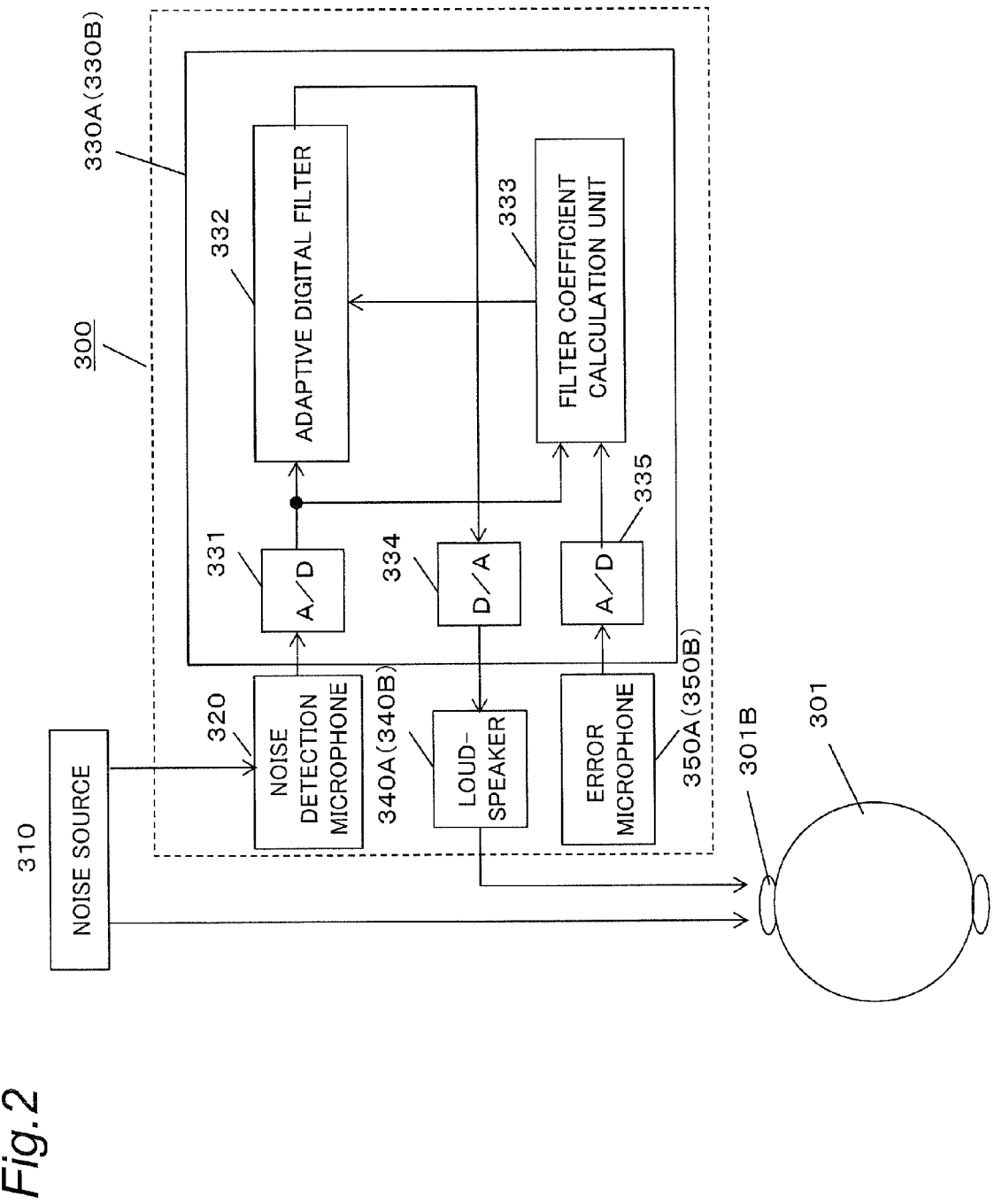
FIG. 2 is a block diagram showing a basic configuration of the noise reduction apparatus according to Embodiment 1.

A basic configuration of the noise reduction apparatus according to Embodiment 1 will be described below with reference to FIG. 2. FIG. 2 is a block diagram showing a basic configuration of the noise reduction apparatus.

A noise reduction apparatus 300 includes a noise detection microphone 320, a noise controller 330a (330b), a loudspeaker 340a (340b), and an error microphone 350a (350b)

The noise detection microphone 320 detects noise generated from a noise source 310, converts the noise into an electric signal, and outputs the electric signal.

The noise controller 330a (330b) includes A/D converters 331 and 335, an adaptive digital filter 332, a filter coefficient calculation unit 333, and a D/A converter 334. The noise controller 330a (330b) generates a control sound signal based on a noise signal from the noise detection microphone 320 and an error audio signal from the error microphone 350a (350b) that makes the error audio signal minimum so as to drive the loudspeaker 340a (340b).

The A/D converter 331 A/D-converts the noise signal from the noise detection microphone 320 and outputs the converted signal to the adaptive digital filter 332 and the coefficient calculation unit 333.

The adaptive digital filter 332 includes multistage taps. The adaptive digital filter 332 is an FIR (Finite Impulse Response) filter that can freely set, for example, filter coefficients of the taps.

The coefficient calculation unit 333 receives a noise signal from the noise detection microphone 320 through the A/D converter 331. The coefficient calculation unit 333 receives an error audio signal from the error microphone 350a (350b) through the A/D converter 335. The coefficient calculation unit 333 calculates the filter coefficients of the adaptive digital filter 332 to make the error audio signal detected by the error microphone 350a (350b) minimum. The coefficient calculation unit 333 updates the current (previously calculated) filter coefficients with the calculated filter coefficients. More specifically, the adaptive digital filter 332 generates a control sound signal such that control sound generated from the loudspeaker 340a (340b) has a phase opposite of the phase of noise from the noise source 310 at an installation position (control point) of the error microphone 350a (350b), and drives loudspeaker 340a (340b) through the D/A converter 334. In this manner, the control sound is output from the loudspeaker 340a (340b), noise from the noise source 310 is canceled by the control sound having the opposite phase, and noise is reduced near an ear 301b of a user 301.

The error microphone 350a (350b) is arranged near the ear 301b of a user 302 as described below, and detects noise reaching the vicinity of the ear 301b of the user 302. Since the noise reduction apparatus according to the embodiment reduces noise that is generated from noise source 310 and reaches the vicinity of the ear 301b of the user 302, the error microphone 350a (350b) detects noise after the noise is reduced. The noise detected after the reduced will be called an "error sound" hereinafter. The error microphone 350a (350b) feeds back the detected error sound signal to the coefficient calculation unit 333 through the A/D converter 335. In this manner, even though noise environments or the like change, noise can be minimized at the position of user's ears.

Figure 3:
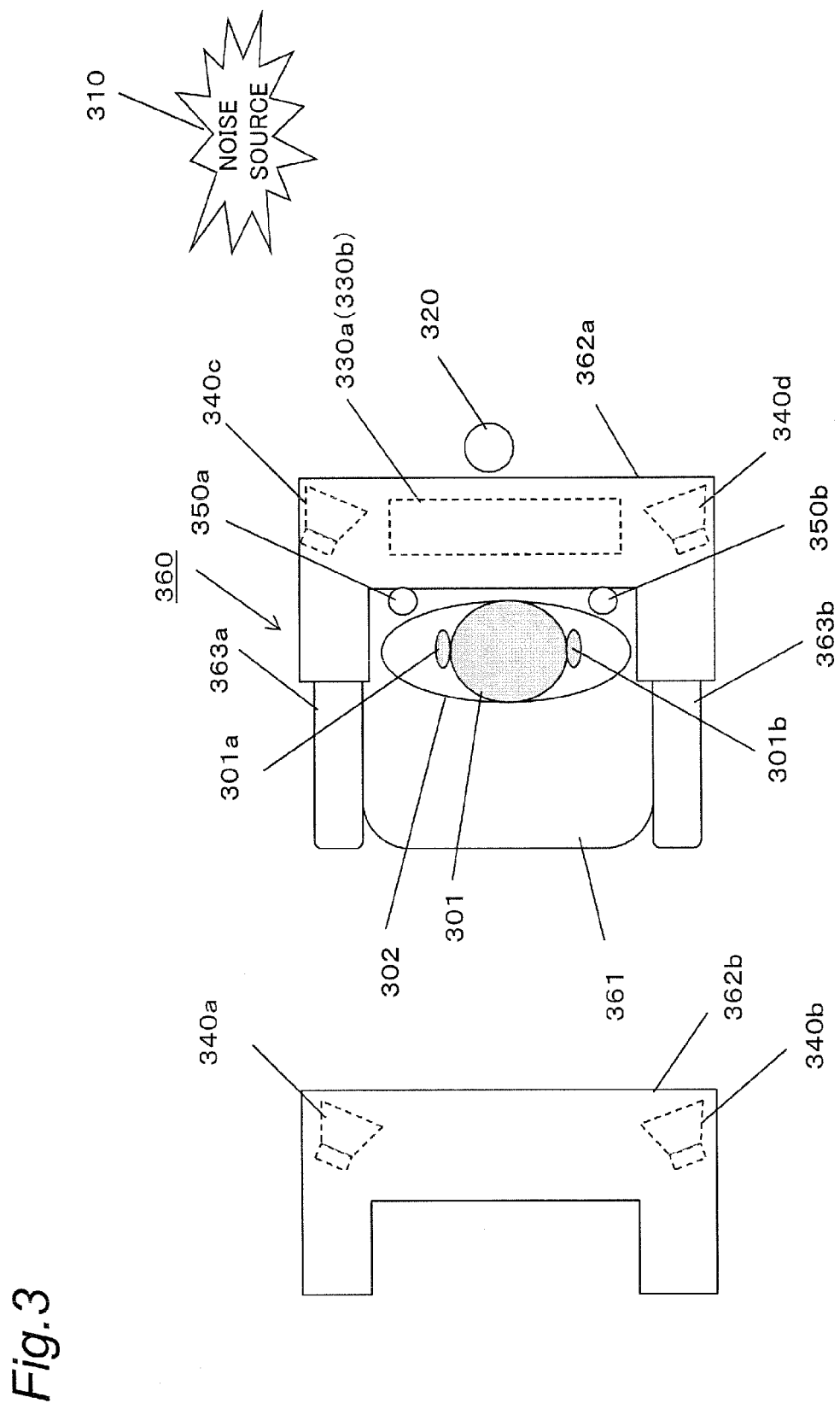
FIG. 3 is a diagram showing a configuration of an installation case of the noise reduction apparatus according to Embodiment 1.

A case in which the noise reduction apparatus according to the embodiment is installed in a passenger room of an airplane will be described below with reference to FIG. 3. FIG. 3 is a plan view showing a state in which the noise reduction apparatus according to the embodiment is installed in the passenger room of the airplane.

Each of the rows of seats 103a, 103b, and 103c (see FIG. 1) in the passenger rooms A, B, and C has a seat 360 shown in FIG. 3.

The seat 360 includes a seat part 361, a backrest part (not shown), a headrest 362a, and armrest parts 363a and 363b.

As the noise source 310, various noise sources that affect an acoustic environment in a passenger room of the airplane are given. As the noise source 310, for example, an engine mounted on an air frame, an air-conditioner arranged in a passenger room, or the like is given. Noise generated from the noise source 310 reaches an outer peripheral portion of a head 301 of the user 302 sit on the seat 360.

The headrest 362a has a C-shape. When the user 302 sits on the seat part 361, the head 301 of the user 302 is surrounded with the headrest 362a. The noise controller 330a (330b) and loudspeakers 340c and 340d are buried in the headrest 362a. Loudspeakers 340a and 340b buried in a headrest 362b of the seat in front of the user 302 are arranged at a position and an angle at which a control sound can be emitted to a right ear 301a and a left ear 301b of the user 302. Error microphones 350a and 350b are arranged at positions near the ears 301a and 301b as control points at which noise is reduced in the headrest 362a. The loudspeakers 340a and 340b does not need to be buried in the headrest 362b. The positions of the loudspeakers 340a and 340b may be set to any positions at which the control sound can be generated for the ears 301a and 301b of the user 302.

The noise detection microphone 320 is arranged on the rear surface of the headrest 362a. The noise detection microphone 320 detects a noise level of noise generated from the noise source 310. The arrangement position of the noise detection microphone 320 does not need to be the rear surface of the headrest 362a. However, the arrangement position of the noise detection microphone 320 is desirably set to a position where noise from the noise source 310 can be sensitively detected and noise sounds from the loudspeakers 340a and 340b do not easily reach.

Figure 4:
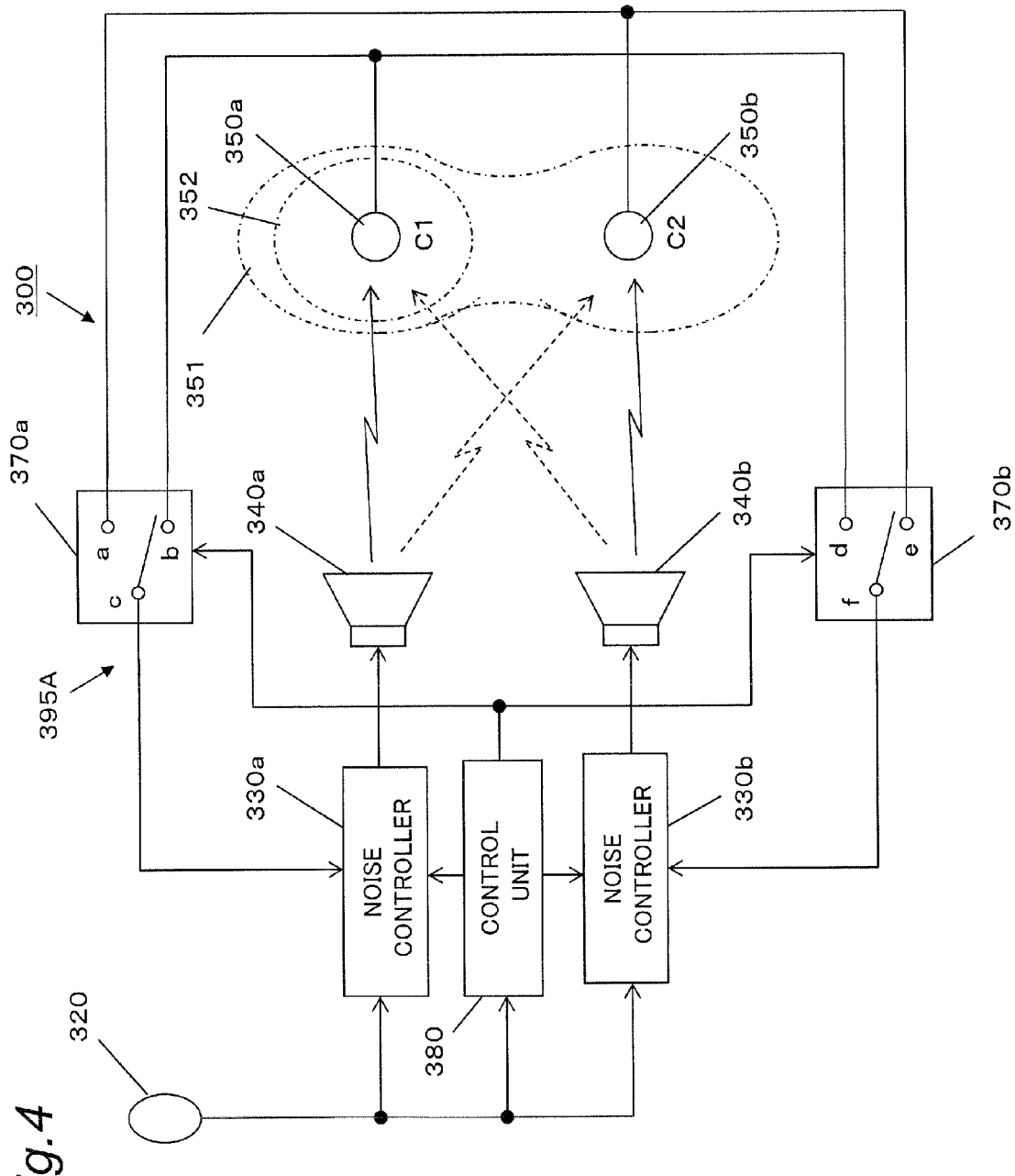
FIG. 4 is a block diagram showing a concrete configuration of the noise reduction apparatus according to Embodiment 1.

An operation of the noise reduction apparatus will be described below with reference to FIG. 4. FIG. 4 is a block diagram showing a concrete configuration of the noise reduction apparatus according to the embodiment. In the embodiment, the case in which the two error microphones are is described. However, this disclosure can be applied to a case in which three or more error microphones are used.

As shown in FIG. 4, the noise reduction apparatus 300 according to the embodiment includes the noise detection microphone 320, the loudspeakers 340a (first loudspeaker) and 340b (second loudspeaker), noise controllers 330a (first noise controller) and 330b (second noise controller), the error microphones 350a (first error microphone) and 350b (second error microphone), selector switches 370a and 370b, and a control unit 380. The control unit 380 and the selector switches 370a and 370b configure an input switching unit 390A.

The noise controller 330a receives a noise signal from the noise detection microphone 320, generates a control sound signal based on the received noise signal, and outputs the generated control sound signal to the loudspeakers 340a and 340b.

The selector switches 370a and 370b switch an input destination of error audio signals from the error microphones 350a and 350b between the noise controller 330a and the noise controller 330b.

The control unit 380 receives the noise signal from the noise detection microphone 320 to control the noise controllers 330a and 330b and selector switches 370a and 370b.

An output terminal c of the selector switch 370a is connected to the noise controller 330a. An input terminal a of the selector switch 370a is connected to the error microphone 350b, and an input terminal b is connected to the error microphone 350a.

An output terminal f of the selector switch 370b is connected to the noise controller 330b. An input terminal d of the selector switch 370b is connected to the error microphone 350a, and an input terminal e is connected to the error microphone 350b.

A noise environment at the seat 360 of the airplane 100 will be described with reference to FIG. 1. Noise at the seat 360 of the airplane 100 depends on distances between the noise sources NS1a and NS1b and the seat 360. For example, a noise level at the seat 360 of the row of seats 103a arranged in front of the noise sources NS1a and NS1b and at a position far from the noise sources NS1a and NS1b is lower than a noise level at the seats 360 of rows of seats 103b and 103c arranged on the side of or on the rear of the noise sources NS1a and NS1b and positions close to the noise sources NS1a and NS1b. The noise environment at the seat 360 of the airplane changes depending on traveling states of the airplane even though an air route is not changed. For example, a noise environment in a takeoff or landing state is different from a noise environment in which the airplane travels at a predetermined speed. The noise environments change depending on changes of an airflow in flight.

In the loudspeakers 340a and 340b, maximum volumes (dynamic ranges) without distortion is predetermined. When the loudspeakers 340a and 340b generate acoustic waves higher than the dynamic ranges, the waveforms of the acoustic waves distorts. For this reason, the noise cannot be correctly canceled. In order to avoid the problem, the loudspeakers 340a and 340b must be used in the ranges of the dynamic ranges thereof. However, when the noise from the noise source 310 is loud, a loud sound may have to be emitted. In this case, the sound cannot be correctly canceled because the control sounds generated from the loudspeakers 340a and 340b are distorted.

In order to cope with the problem, the control unit 380 of the noise reduction apparatus 300 performs the following control operation. More specifically, when the noise level detected by the noise detection microphone 320 is higher than a preset predetermined threshold value, the control unit 380 reduces the number of control points at which noise is reduced to one (reduces the number of error microphones used in reduction in noise) and controls the two loudspeakers 340a and 340b to divisionally generate a control sound.

For example, it is assumed that a distance between the loudspeaker 340a and the error microphone 350a is 50 cm, and that the loudspeaker 340a can output a control sound at a level of 90 dB at the position (control point C1) of the error microphone 350a. It is assumed that a distance between the loudspeaker 340b and the error microphone 350b is 50 cm, and that the loudspeaker 340b can output a control sound at a level of 90 dB at the position (control point C2) of the error microphone 350b. When noise at each of the control points is equal to or less than 90 dB, the noise can be canceled by the corresponding single loudspeaker. For this reason, the two error microphones 350a and 350b are provided, noises can be independently reduced by the two loudspeakers 340a and 340b. On the other hand, when the noises at the control point are higher than 90 dB, each of the noises cannot be canceled by each of the single loudspeakers. For this reason, the control point C1 and the control point C2 to be used is limited to one of them, i.e., an error microphone to be used is limited to any one of the error microphones 350a and 350b to integrate the capabilities of the two loudspeakers 340a and 340b (the control sound is shared by the two loudspeakers 340a and 340b) so as to reduce the noise.

The control operation of the control unit 380 will be concretely described below. In a normal state, i.e., when a noise level detected by the noise detection microphone 320 is equal to or less than the predetermined threshold value, the control unit 380 switches the output terminal c of the selector switch 370a to the input terminal b. For this reason, the error sound detected by the error microphone 350a is fed back to the noise controller 330a. As a result, the loudspeaker 340a generates a control sound that makes the error sound of the error microphone 350a minimum. On the other hand, the output terminal f of the selector switch 370b is switched to the input terminal e. For this reason, the error sound detected by the error microphone 350b is fed back to the noise controller 330b. As a result, the loudspeaker 340b generates a control sound that makes the error sound of the error microphone 350b minimum.

In this manner, when the noise level is the predetermined value or less (normal state), a control space of the noise reduction apparatus 300 is like a region 351, and noise can be reduced in a wide area including both the error microphones 350a and 350b.

On the other hand, when the noise level detected by the noise detection microphone 320 is higher than the threshold value, the switching state of the selector switch 370a does not change. However, the output terminal f of the selector switch 370b is switched to the input terminal d. For this reason, the error sound detected by the error microphone 350a is fed back to the noise controller 330b. As a result, the loudspeaker 340b generates a control sound that makes the error sound of the error microphone 350a minimum. In the case, control sounds that minimize the error sound of the error microphone 350a are consequently generated from the two loudspeakers 340a and 340b. A region 352 in the control space in this case is smaller than the region 351 obtained when the noise level is lower than the predetermined threshold value. However, a volume of the control sound of one speaker may be smaller than that of the control sound generated from only one speaker 340a. As a result, even though the noise level is high, a volume of the control sound generated from each of the loudspeakers 340a and 340b can be caused to fall within the dynamic range of the corresponding loudspeaker. For example, when the level of an error sound at the control point is 10, each of the loudspeakers needs to only output sound in charge of 5. For this reason, even though the maximum capability of each of the loudspeakers is, for example, 5, the two loudspeakers can be used within the allowable capability. Thus, even though the error sound level exceeds the maximum capability of each of the loudspeakers, noise at at least one of the control points can be reduced. The region 352 in the control space when the noise level is higher than the predetermined threshold value is smaller than the region 351 obtained when the noise level is lower than the predetermined threshold value as described above. In the drawing, the region 352 covers only one of the control points. However, the area of the new region 352 changes depending on frequencies of noise. For example, the area increases in inverse proportion to the frequency, and the area sufficiently covers both the control points at a predetermined frequency or less than the predetermined frequency. More specifically, depending on the frequencies of noise, a sufficient noise reduction effect can be obtained at both the control points C1 and C2.

2. Effect or the Like

As described above, in the embodiment, the noise reduction apparatus 300 includes: the plurality of loudspeakers 340a and 340b that generate control sounds to cancel noises at the plurality of control points C1 and C2 at which noise are reduced; the plurality of noise controllers 330a and 330b (control sound signal generating units), each of the plurality of noise controllers 330a and 330b being provided to correspond to each of the plurality of loudspeakers 340a and 340b and generating control sound signal to drive a corresponding loudspeaker of the plurality of loudspeakers 340a and 340b; and the plurality of error microphones 350a and 350b, each of the error microphones 340a and 340b being arranged at a corresponding control point of the control points C1 and C2 and detecting error sound between the noise at the corresponding control point and the control sound at the corresponding control point, each of the noise controllers 330a and 330b (control sound signal generating units) generates control sound signal based on the error sounds detected by a corresponding error microphone of the plurality of error microphones 350a and 350b, and the noise reduction apparatus 300 further includes an input switching unit 390 that, when a level of the noise at a predetermined position is higher than the predetermined threshold value, feeds an error audio signal at a predetermined control point of the plurality of control points C1 and C2 into each of the noise controllers 330a and 330b.

In this manner, when the noise level detected by the noise detection microphone is higher than a predetermined threshold value, an error audio signal at the predetermined control point of the plurality of control points C1 and C2 is input into each of the noise controllers 330a and 330b. As a result, the loudspeakers 340a and 340b output control sounds based on the same error audio signal. More specifically, the two loudspeakers can divisionally output the control sound for one control point. Thus, noise at at least one of the control points can be reduced regardless of noise levels.

In the noise reduction apparatus 300 according to the embodiment, the plurality of loudspeakers include the first and second loudspeakers 340a and 340b, the plurality of error microphones include the first and second error microphones 350a and 350b, the noise controllers (control sound signal generating units) include the noise controllers 330a and 330b (first and second control sound signal generating units), when a noise level detected by the noise detection microphone 320 is equal to or less than the predetermined threshold value, an input switching unit 395A feeds an output of the first error microphone 350a to the noise controller 330a (first control sound signal generating unit) and feeds an output of the second error microphone 350a to the noise controller 330b (second control sound signal generating unit), and when the noise level detected by the noise detection microphone 320 is higher than the predetermined threshold value, the input switching unit 395A performs control such that one control point of the plurality of control points C1 and C2 is selected and an output of an error microphone arranged at the selected control point among the first and second error microphones 350a and 350b is input to both the noise controllers 330a and 330b (first and second control sound signal generating units).

In this manner, when the noise level detected by the noise detection microphone 320 is higher than the predetermined threshold value, one control point of the plurality of control points C1 and C2 is selected, and an output of the error microphone 350a or 350b arranged at the selected control point among the first and second error microphones 350a and 350b is input to both the noise controllers 330a and 330b. As a result, the loudspeakers 340a and 340b output control sounds based on the same error audio signal. More specifically, the two loudspeakers 340a and 340b can divisionally output the control sound for one control point. For this reason, the loudspeakers 340a and 340b can be used within the allowable capabilities thereof. Even though the error sound level exceeds the maximum capability of each of the loudspeakers, noise at at least one of the control points can be reduced.

One control point of the plurality of control points C1 and C2 may be configured to be able to be determined by a user. Depending on characteristics of noise, the user may feel that noise at another control point is louder than that at the selected control point. Thus, the control point to be selected is configured to be able to be determined by a user. For this reason, user's convenience is improved.

Embodiment 2

Embodiment 2 will be described below with reference to FIG. 5.

1. Configuration

Figure 5:
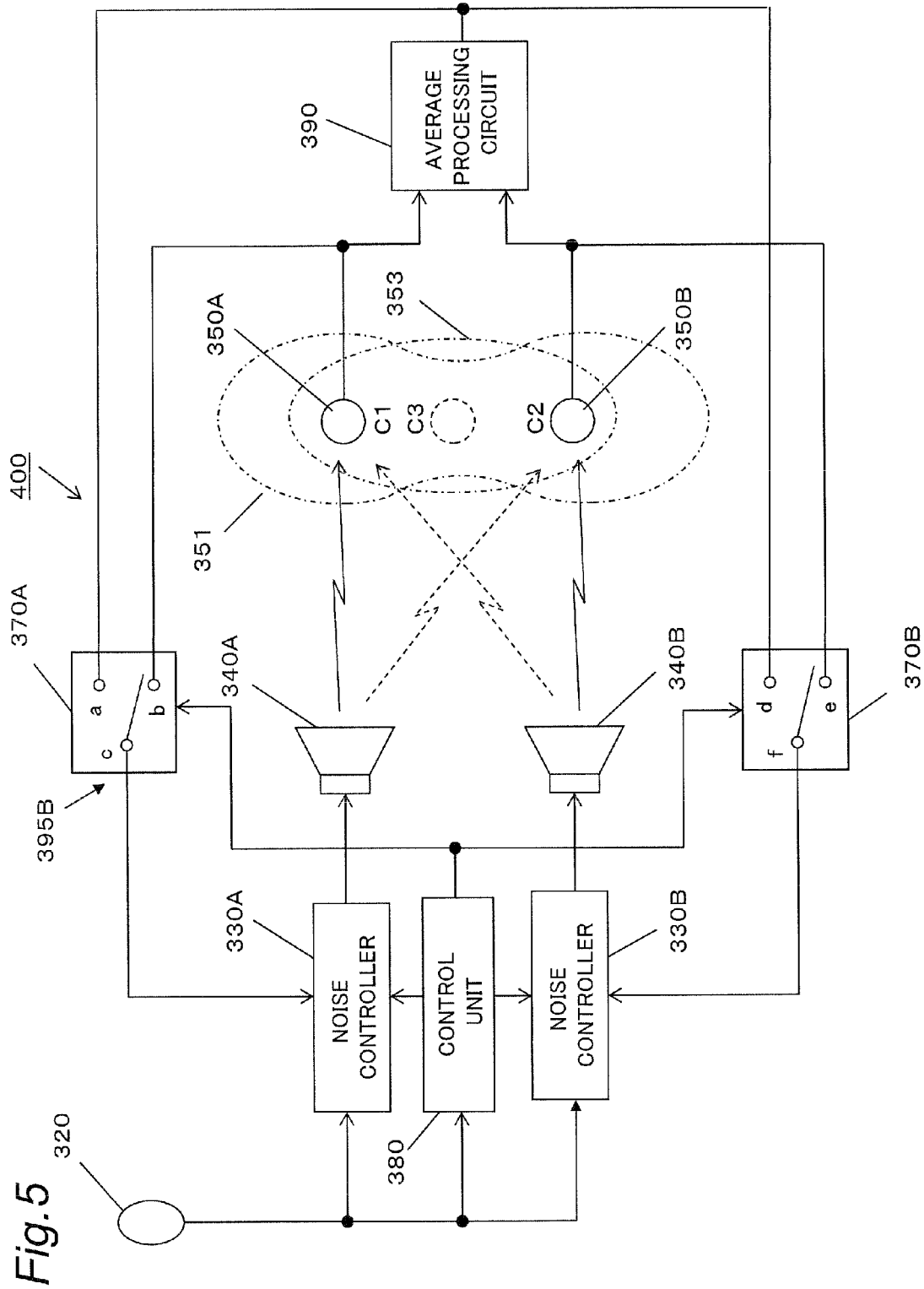
FIG. 5 is a block diagram showing a concrete configuration of a noise reduction apparatus according to Embodiment 2.

FIG. 5 is a block diagram showing a concrete configuration of a noise reduction apparatus according to the embodiment.

A noise reduction apparatus 400 according to the embodiment is obtained by further arranging an average processing circuit 390 in the noise reduction apparatus 300 according to Embodiment 1. The average processing circuit 390 outputs an average error audio signal obtained by averaging an error audio signal from the error microphone 350a and an error audio signal from the error microphone 350b. An output of the average processing circuit 390 is connected to the input terminal a of the selector switch 370a and the input terminal d of the selector switch 370b. The control unit 380, the selector switches 370a and 370b, and the average processing circuit 390 configure an input switching unit 395B. The other configurations are the same as those in Embodiment 1. The same symbols as those in Embodiment 1 denote the same configurations in Embodiment 2.

When a noise level detected by the noise detection microphone 320 is higher than a predetermined threshold value, the noise reduction apparatus 400 performs the same operation as that of the noise reduction apparatus 300 of Embodiment 1.

On the other hand, when the noise level detected by the noise detection microphone 320 is higher than the threshold value, the output terminal c of the selector switch 370a is switched to the input terminal a. For this reason, an output of the average processing circuit 390 is fed back to the noise controller 330a. On the other hand, the output terminal f of the selector switch 370b is switched to the input terminal d. For this reason, an output of the average processing circuit 390 is fed back to the noise controller 330b. As a result, the loudspeaker 340a and the loudspeaker 340b generate control sounds that make the output (average error audio signal) of the average processing circuit 390 minimum. More specifically, this state is equivalent to a state in which a virtual error microphone is arranged at approximately the center position between the error microphone 350a and the error microphone 350b. More specifically, the state is approximately equivalent to a state in which a virtual control point C3 is arranged at approximately the center position between the position (control point C1) of the error microphone 350a and the position (control point C2) of the error microphone 350b.

In this manner, in the embodiment, control sounds that minimize an error audio signal at the virtual control point C3 are generated from the two loudspeakers 340a and 340b. A region 353 in the control space in this case is smaller than the region 351 obtained when the noise level is lower than the predetermined threshold value. However, the original control points C1 and C2 are included in the region 351. For this reason, when noise at the virtual control point C3 is reduced, noises at the original control points C1 and C2 are also reduced. In particular, in the embodiment, since the control sound for one control point C3 is divisionally output by the two loudspeakers, a volume of the control sound of one loudspeaker may be smaller than that of a control sound generated from only one loudspeaker 340a. As a result, even though the noise level is high, a volume of the control sound generated from each of the loudspeakers 340a and 340b can be caused to fall within the dynamic range of the corresponding loudspeaker. Thus, noise reduction can be preferably performed.

2. Effect or the Like

As described above, in the embodiment, the noise reduction apparatus 300 includes: the plurality of loudspeakers 340a and 340b that generate control sounds to cancel noises at the plurality of control points C1 and C2 at which noise are reduced; the plurality of noise controllers 330a and 330b (control sound signal generating units), each of the plurality of noise controllers 330a and 330b being provided to correspond to each of the plurality of loudspeakers 340a and 340b and generating control sound signal to drive a corresponding loudspeaker of the plurality of loudspeakers 340a and 340b; and the plurality of error microphones 350a and 350b, each of the error microphones 340a and 340b being arranged at a corresponding control point of the control points C1 and C2 and detecting error sound between the noise at the corresponding control point and the control sound at the corresponding control point, the noise controllers 330a and 330b (control sound signal generating units) generating control sound signals based on the error sounds detected by a corresponding error microphone of the plurality of error microphones 350a and 350b, and the noise reduction apparatus 300 further includes an input switching unit 395B that, when a level of the noise at a predetermined position is higher than the predetermined threshold value, feeds an error audio signal at the control point C3 of which the number is smaller than the number of control points C1 and C2 and that is newly set based on the plurality of control points C1 and C2 into each of the noise controllers 330a and 330b.

In this manner, when the noise level detected by the noise detection microphone is higher than a predetermined threshold value, an error audio signal at the control point C3 of which the number is smaller than the number of control points C1 and C2 and that is newly set based on the plurality of control points C1 and C2 is input to each of the noise controllers 350a and 350b. For this reason, the two loudspeakers can divisionally output the control sound for one control point C3. At this time, when noise at the virtual control point C3 is reduced, noises at the original control points C1 and C2 are also reduced. Thus, even though the error sound level exceeds the maximum capability of each of the loudspeakers, noise at the control points can be reduced.

In the noise reduction apparatus 400 according to the embodiment, the plurality of loudspeakers 340a and 340b include the first and second loudspeakers 340a and 340b, the plurality of error microphones 350a and 350b include the first and second error microphones 350a and 350b, the noise controllers 330a and 330b (control sound signal generating units) include the noise controllers 330a and 330b (first and second control sound signal generating units), and the input switching unit 395B further includes the average processing circuit 390 that averages outputs of the first and second error microphones 350a and 350b and outputs the averaged output as an output at the virtual third control point C3 newly set at approximately a center position between the first and second control points C1 and C2, and when the noise level detected by the noise detection microphone 320 is equal to or less than the predetermined threshold value, the input switching unit 395B feeds an output of the first error microphone 350a to the noise controller 330a (first control sound signal generating unit) and feeds an output of the second error microphone 350b to the noise controller 330b (second control sound signal generating unit), and when the noise level detected by the noise detection microphone 320 is higher than the predetermined threshold value, the input switching unit 395B feeds an output of the average processing circuit 390 into both the noise controllers 330a and 330b (first and second control sound signal generating units).

In this manner, when the noise level detected by the noise detection microphone 320 is higher than the predetermined threshold value, the output of the average processing circuit 390 is input to both the noise controllers 330a and 330b. As a result, the loudspeakers 340a and 340b output control sounds based on the same error audio signal. More specifically, the two loudspeakers 340a and 340b can divisionally output the control sound for one control point C3. For this reason, the loudspeakers 340a and 340b can be used within the allowable capabilities thereof. Even though the error sound level exceeds the maximum capability of each of the loudspeakers 340a and 340b, noise at the control points C1 and C2 can be reduced.

Embodiment 3

Embodiment 3 will be described below with reference to FIG. 6.

1. Configuration

Figure 6:
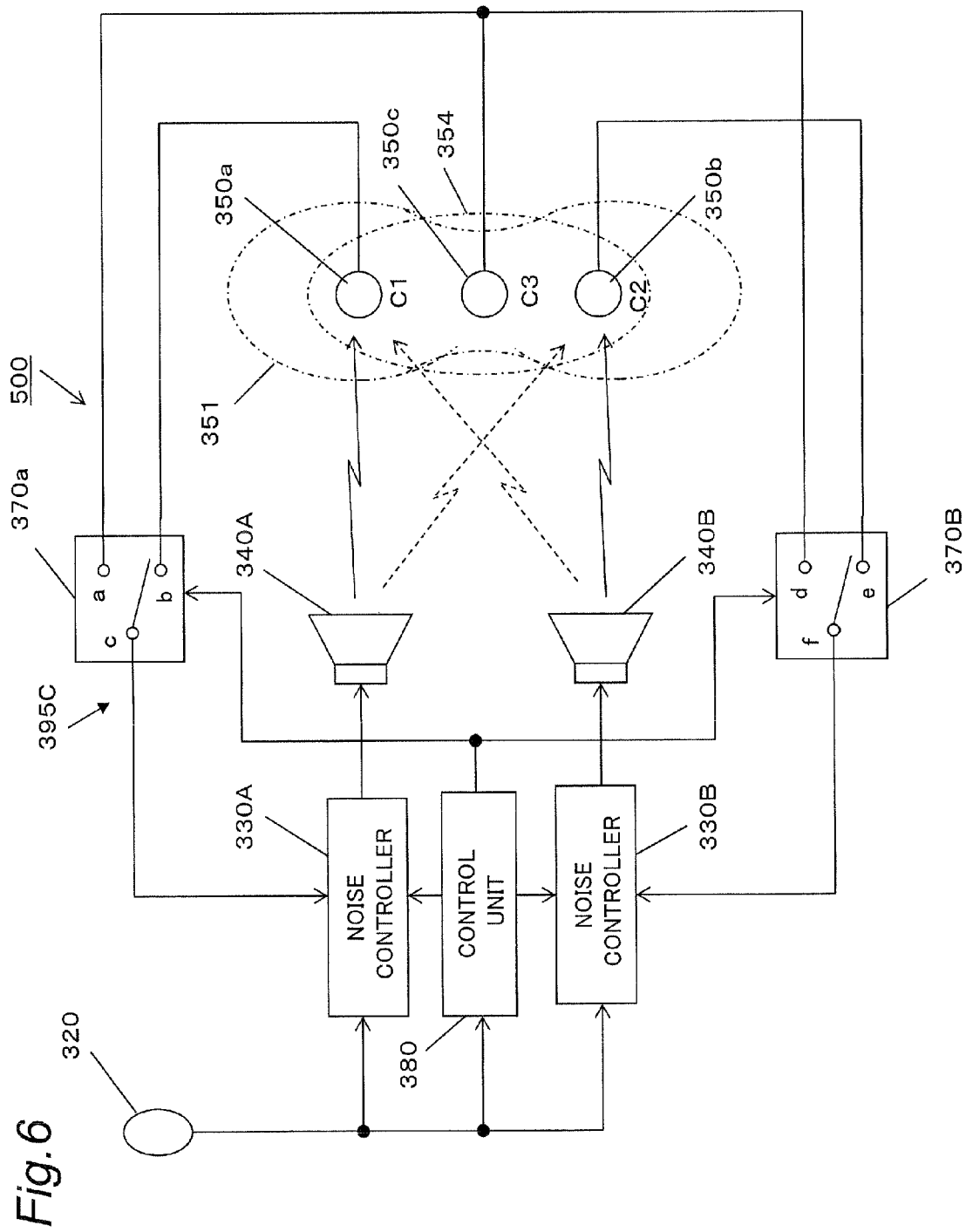
FIG. 6 is a block diagram showing a concrete configuration of a noise reduction apparatus according to Embodiment 3.

FIG. 6 is a block diagram showing a concrete configuration of a noise reduction apparatus according to the embodiment.

A noise reduction apparatus 500 according to the embodiment is obtained by further arranging a third error microphone 350c in the noise reduction apparatus 300 according to Embodiment 1. The third error microphone 350c, for example, is arranged at approximately the center position on a straight line connecting the error microphone 350a to the error microphone 350b. More specifically, the control point C3 is arranged at approximately the center position between the position (control point C1) of the error microphone 350a and the position (control point C2) of the error microphone 350b. An error audio signal from the error microphone 350c is input to the input terminal a of the selector switch 370a and the input terminal d of the selector switch 370b. The control unit 380, the selector switches 370a and 370b, and the error microphone 350c configure an input switching unit 395C. The other configurations are the same as those in Embodiment 1. The same symbols as those in Embodiment 1 denote the same configurations in Embodiment 3.

When a noise level detected by the noise detection microphone 320 is equal to or less than a predetermined threshold value, the noise reduction apparatus 500 performs the same operation as that of the noise reduction apparatus 300 of Embodiment 1.

On the other hand, when the noise level detected by the noise detection microphone 320 is higher than the threshold value, the output terminal c of the selector switch 370a is switched to the input terminal a. The error audio signal from the error microphone 350c is fed back to the noise controller 330a. The output terminal f of the selector switch 370b is switched to the input terminal d. The error audio signal from the error microphone 350c is fed back to the noise controller 330b. As a result, the loudspeakers 340a and 340b generate control sounds that make an output (error audio signal) of the error microphone 350c minimum.

In this manner, in the embodiment, control sounds that minimize an error audio signal from the error microphone 350c at the control point C3 are generated from the two loudspeakers 340a and 340b. A region 354 in the control space in this case is smaller than the region 351 obtained when the noise level is lower than the predetermined threshold value. However, the original control points C1 and C2 are included in the region 351. For this reason, when noise at the control point C3 is reduced, noises at the original control points C1 and C2 are also reduced. In particular, in the embodiment, since the control sound for one control point C3 is divisionally output by the two loudspeakers, a volume of the control sound of one loudspeaker may be smaller than that of a control sound generated from one loudspeaker 340a. As a result, even though the noise level is high, a volume of the control sound generated from each of the loudspeakers 340a and 340b can be caused to fall within the dynamic range of the loudspeakers 340a and 340b. Thus, noise reduction can be preferably performed.

2. Effect or the Like

As described above, in the embodiment, the noise reduction apparatus 300 includes: the plurality of loudspeakers 340a and 340b that generate control sounds to cancel noises at the plurality of control points C1 and C2 at which noise are reduced; the plurality of noise controllers 330a and 330b (control sound signal generating units), each of the plurality of noise controllers 330a and 330b being provided to correspond to each of the plurality of loudspeakers 340a and 340b and generating control sound signal to drive a corresponding loudspeaker of the plurality of loudspeakers 340a and 340b; and the plurality of error microphones 350a and 350b, each of the error microphones 340a and 340b being arranged at the control point C1 and C2 and detect error sound between the noise a corresponding control point of and the control sound a corresponding control point of, each of the noise controllers 330a and 330b (control sound signal generating units) generates control sound signal based on the error sounds detected by a corresponding error microphone of the plurality of error microphones 350a and 350b, and the noise reduction apparatus 300 further includes the input switching unit 395C that, when a level of the noise at a predetermined position is higher than the predetermined threshold value, feeds an error audio signal at the control point C3 of which the number is smaller than the number of control points C1 and C2 and that is newly set based on the plurality of control points C1 and C2 into each of the noise controllers 330a and 330b.

In this manner, when the noise level detected by the noise detection microphone is higher than a predetermined threshold value, an error audio signal at the control point C3 of which the number is smaller than the number of control points C1 and C2 and that is newly set based on the plurality of control points C1 and C2 is input to each of the noise controllers 330a and 330b. As a result, the loudspeakers 340a and 340b output control sounds based on the same error audio signal. More specifically, the two loudspeakers can divisionally output the control sound for one control point C3. At this time, when noise at the virtual control point C3 is reduced, noises at the original control points C1 and C2 are also reduced. Thus, as in Embodiment 1, even though the error sound level exceeds the maximum capability of each of the loudspeakers, noise at the control points C1 and C2 can be reduced.

In the noise reduction apparatus 300 according to the embodiment, the plurality of loudspeakers 340a and 340b include the first and second loudspeakers 340a and 340b, the plurality of error microphones 350a and 350b include the first and second error microphones 350a and 350b, the noise controllers 330a and 330b (control sound signal generating units) include the noise controllers 330a and 330b (first and second control sound signal generating units), and the input switching unit 395C further includes a third error microphone 354 arranged at the third control point C3 newly set at approximately a center position of a straight line connecting the first and second error microphones 350a and 350b, when a noise level detected by the noise detection microphone 320 is equal to or less than the predetermined threshold value, the input switching unit 395C feeds an output of the first error microphone 350a to the noise controller 330a (first control sound signal generating unit) and feeds the output of the second error microphone 350a to the noise controller 330b (second control sound signal generating unit), and when the noise level detected by the noise detection microphone 320 is higher than the predetermined threshold value, the input switching unit 395C feeds an output of the third error microphone 354 into both the noise controllers 330a and 330b.

In this manner, when the noise level detected by the noise detection microphone 320 is higher than the predetermined threshold value, the output of the third error microphone 350c arranged at the control point C3 is input into both the noise controllers 330a and 330b. Thus, the two loudspeakers 340a and 340b can divisionally output the control sound for one control point C3. For this reason, the loudspeakers 340a and 340b can be used within the allowable capabilities thereof.

Even though the error sound level exceeds the maximum capability of each of the loudspeakers 340a and 340b, noise at the control points C1 and C2 can be reduced.

Another Embodiment

As described above, as an exemplification of the technique disclosed in this application, Embodiments 1 to 3 have been described. However, the technique in the disclosure can be applied to not only the embodiments but also embodiments in which a change, replacement, addition, omission, and the like are arbitrarily performed. The constituent elements described in Embodiments 1 to 3 are combined to each other to make it possible to obtain a new embodiment.

The embodiments explain an example in which a noise level is detected by a noise detection microphone. However, a noise reduction apparatus may not include a noise detection microphone. In this case, as the above noise level, a noise level obtained as follows. That is, a noise level at a predetermined position inside the aircraft is measured, a noise level at each of the seats is estimated based on the noise level at a predetermined position, and the estimated noise level is used as the above noise level. Further, as the above noise level, a noise level obtained as follows. That is, a noise level at each of seats is measured by an error microphone in a state in which speakers do not emit control sound, and the measured noise level is used as the above noise level. In this case, since the noise level is measured at each seat, noise reduction can be performed accurately at each seat.

A noise level estimated based on a noise level using a sensor that can acquire information relating to a noise instead of the noise detecting microphone. For example, a sensor such as a vibration sensor, or a rotation sensor which detects rotation speed or the like of an engine of, for example, an airplane or a vehicle.

The embodiments explain an example in which one noise detection microphone is arranged. However, when a plurality of noise detection microphones are arranged, an average level or an intermediate level thereof may be set to a noise level in the vicinity.

In embodiments, when the noise level detected by the noise detection microphone 320 is equal to or less than the predetermined threshold value (in a normal state), each of the noise reduction apparatuses two control points exists. However, the number of control points is not limited to two, and two or more control points may be arbitrarily provided. In this case, depending on noise levels, the number of control points may be arbitrarily changed.

The embodiments explain the example in which a noise level in the vicinity is detected to determine the number of control points used to reduce noise. However, the noise reduction apparatus according to the embodiment can also be used as described below. For example, when the noise reduction apparatus is mounted on each seat of an airplane, the number of control points may be determined whether a seat is provided in the front side position of the engine or behind the engine. More specifically, since a noise level at the rear position of the engine is higher than a noise level at the front position of the engine, the number of control points at the seat behind the engine may be smaller than the number of control points ahead of the engine (from the beginning). For example, the number of control points in the noise reduction apparatus arranged on the row of seats 103c in FIG. 1 may be smaller than the number of control points in the noise reduction apparatus arranged on the row of seats 103a.

The number of control points may be determined depending on distances from a noise source. More specifically, since a noise level becomes high when the distance from the noise source is short, the number of control points may be reduced at a seat having a short distance from the noise source. For example, when the noise sources are engines 102a and 102b in FIG. 1, the number of control points in the noise reduction apparatus arranged on the row of seats 103b may be smaller than the number of control points in the noise reduction apparatus arranged on the row of seats 103a.

The predetermined threshold value may be changed depending on frequencies of noise detected by a noise detection microphone.

More specifically, the predetermined threshold value may be changed based on a noise level in a specific frequency band instead of a noise level in the full frequency band, to determine the number of control points. Dynamic ranges of loudspeakers sometimes vary depending on frequencies of control sounds to be output. In this case, in a frequency band having a narrow dynamic range, a noise level may be detected. In this case, the predetermined threshold value is preferably made smaller than that in a frequency band having a wide dynamic range. In a loudspeaker, for example, a capability to output a 100-Hz control sound is smaller than the capability to output a 1-kHz control sound in many cases. Thus, in this case, a predetermined threshold value may be set by a noise level at 100 Hz, and the number of control points may be determined.

More specifically, when a frequency of noise detected by a noise detection microphone is small, the predetermined threshold value may be made small.

The embodiment explains the example in which the threshold value of the noise level is determined by the dynamic range of the loudspeaker. However, the predetermined threshold value of the noise level may be determined by the S/N ratio of the control sound output from the loudspeaker. When the control sound increases in volume, the S/N ratio of the control sound decreases due to generation of a harmonic component or the like. When the S/N ratio of the control sound decreases, the characteristics of the control sound also change, and a sufficient noise reduction effect cannot be obtained. Thus, a threshold value of a noise level may be determined by the S/N ratio of a control sound from a loudspeaker.

Detection of a noise level to be compared with a predetermined threshold value can be more correctly performed at a position close to the error microphone. For this reason, the detection of the noise level may be performed by the error microphone itself. For example, the noise level is detected by the error microphone immediately before the noise reduction apparatus starts a noise reduction operation, and the number of control points may be set based on the detected volume level.

Even though a noise level does not change, when a distance from a loudspeaker to an error microphone is long, the capability of the loudspeaker easily becomes short. In such a case, the noise reduction apparatus according to each of the embodiments is particularly effective.

In the embodiment, noise reduction for a noise-reduction-target seat is performed by outputting a control sound from a loudspeaker arranged on the seat in front of the target seat. However, the noise reduction for the noise-reduction-target seat may be performed by outputting a control sound from a loudspeaker arranged on the side of the target seat. The technical idea of the disclosure can also be applied to the case.

(Variation 1)

In the embodiment, when the noise level detected by the noise detection microphone 320 is lower than or equal to the predetermined threshold value, the loudspeaker 340a is driven by the control sound signal generated by the noise controllers 330a based on the error sound detected by the error microphone 350a, and the loudspeaker 340b is driven by the control sound signal generated by the noise controllers 330b based on the error sound detected by the error microphone 350b. However, it is not limited to this. That is, the loudspeaker 340a may be driven by the control sound signal generated based on the error sound detected by the error microphones 350a and 350b, and the loudspeaker 340b may be driven by the control sound signal generated based on the error sound detected by the error microphones 350a and 350b. In this case, a noise controller 330a2 is provided that generates control sound signal based on the error sound detected by the error microphone 350b. Both the control sound signal generated by the noise controller 330a based on the error sound detected by the error microphone 350a and the control sound signal generated by the noise controller 330a2 based on the error sound detected by the error microphone 350b are output to the loud speaker 340a. Further, a noise controller 330b2 is provided that generates control sound signal based on the error sound detected by the error microphone 350a. Both the control sound signal generated by the noise controller 330b based on the error sound detected by the error microphones 350b and the control sound signal generated by the noise controller 330b2 based on the error sound detected by the error microphones 350a are output to the loud speaker 340b. In this case, each of the noise controllers performs a different process each other according to a relationship of positions between the speakers 340a, 340b and the error microphones 350a, 350b. For this reason, each of the noise controllers outputs different control sound signal each other. With this configuration, level of the error signal in the control points C1 and C2 is reduced more effectively.

In the variation, when the noise level detected by the noise detection microphone 320 is higher than the predetermined threshold value, one of error sound signals detected by error microphones 350a and 350b is input to all the noise controllers 330a, 330a2, 330b, 330b2 like the embodiment 1. With this configuration, the same effect in the first embodiment is performed.

Further, in the variation, when the noise level detected by the noise detection microphone 320 is higher than the predetermined threshold value, average of the error sound signals detected by error microphones 350a and 350b may be input to all the noise controllers 330a, 330a2, 330b, 330b2 like the embodiment 2. With this configuration, the same effect in the embodiment 2 is performed.

Further, in the variation, when the noise level detected by the noise detection microphone 320 is higher than the predetermined threshold value, an error sound signal detected by a microphone 350c that is provided in addition to the error microphones 350a and 350b may be input to all the noise controllers 330a, 330a2, 330b, 330b2 like the embodiment 3. With this configuration, the same effect in the embodiment 3 is performed.

(Variation 2)

Figure 7:
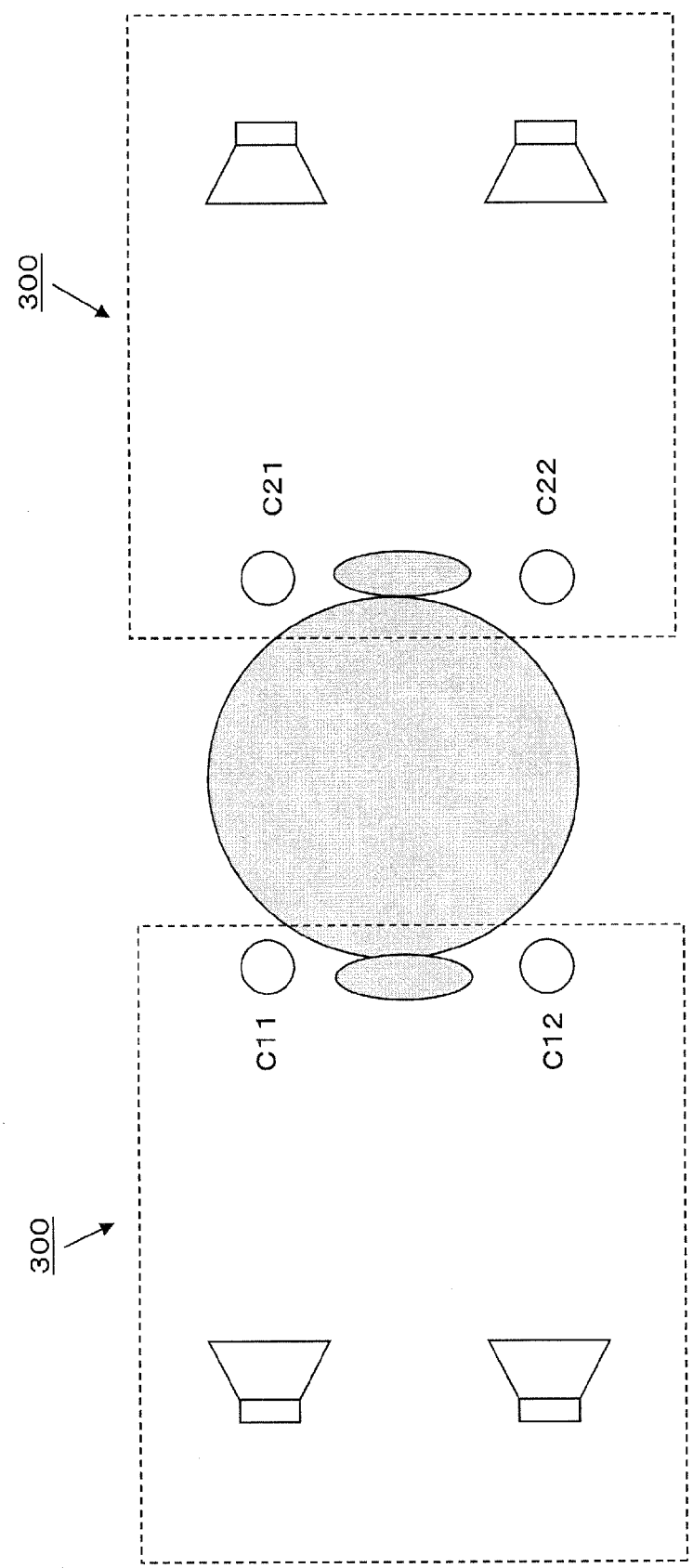
FIG. 7 is a diagram showing a configuration of a noise reduction apparatus according to variation 2.

In the embodiments, it is described that a case two control points C1 and C2 are provided corresponding to positions of the left and right ears of a user. However it is not limited to this. That is, as shown in FIG. 7, two control points C11 and C12 are provided near the left ear of the user, and two control points C21 and C22 are provided near the right ear of the user. The noise reduction apparatus 300 according to the embodiment 1 is provided for the control points C11 and C12, and the noise reduction apparatus 300 according to the embodiment 1 is provided for the control points C21 and C22. Each of the noise reduction apparatuses 300 operates based on whether or not the noise level detected by the noise detection microphone 320 is higher than the predetermined threshold value like the embodiment 1. With this configuration, error noises near the ears of the user are reduced precisely.

In the variation, the noise reduction apparatus 400 according to the embodiment 2 may be provided for the control points C11 and C12, and the noise reduction apparatus 400 according to the embodiment 2 may be provided for the control points C21 and C22.

In the variation, the noise reduction apparatus 500 according to the embodiment 3 may be provided for the control points C11 and C12, and the noise reduction apparatus 500 according to the embodiment 3 may be provided for the control points C21 and C22.

In the variation, one of the noise reduction apparatuses 300, 400, 500 according to the embodiments may be provided for the control points C11 and C12, and the other noise reduction apparatus of the noise reduction apparatuses 300, 400, 500 according to the embodiments may be provided for the control points C21 and C22.

(Variation 3)

In the variation 2, two control points C11 and C12 are provided near the left ear of the user, and two control points C21 and C22 are provided near the right ear of the user. One of the noise reduction apparatuses 300, 400, 500 according to the embodiments is provided for the control points C11 and C12, and one of the noise reduction apparatus of the noise reduction apparatuses 300, 400, 500 according to the embodiments is provided for the control points C21 and C22. However, it is not limited to this. That is, control points C11 to C1$n$ more than or equal to 3 may be provided near the left ear of the user, and two control points C21 to C2$n$ more than or equal to 3 may be provided near the right ear of the user. In this case, for the control points C11 to C1$n$, error microphones, noise controllers, and loudspeakers equal to or lager than the number of the control points C11 to C1$n$ are provided in one of the noise reduction apparatuses according to the embodiments. Further, for the control points C21 to C2$n$, error microphones, noise controllers, and loudspeakers equal to or lager than the number of the control points C21 to C2$n$ may be provided in one of the noise reduction apparatuses according to the embodiments. It is noted that half of the number of the control points of one of the noise reduction apparatuses according to the embodiments may be provided.

As described above, as an exemplification of the technique in the disclosure, the embodiments have been described. For this purpose, the accompanying drawings and the detailed description have been provided.

Thus, the constituent elements described in the accompanying drawings and the detailed description can include not only constituent elements that are required for solving the problems but also constituent elements that are not required for solving the problem. For this reason, although the unnecessary constituent elements are described in the accompanying drawings and the detailed description, it should not be authorized that the unnecessary constituent elements are required.

In addition, since the embodiment illustrates the technique in the disclosure, various changes, replacements, additions, omissions, and the like can be made in the scope of claims or a scope equivalent thereto.

INDUSTRIAL APPLICABILITY

The noise reduction apparatus according to the disclosure is useful as a noise reduction apparatus used in a space in an airplane, a train, a vehicle, or the like in which noise environments change.

What is claimed is:

1. A noise reduction apparatus comprising:
a plurality of loudspeakers that generate control sounds to cancel noises at a plurality of control points at which noise is to be reduced;
a plurality of control sound signal generating units, each of the control sound signal generating units being provided to correspond to each of the plurality of loudspeakers and generating a control sound signal to drive a corresponding loudspeaker of the plurality of loudspeakers; and
a plurality of error microphones, each of the error microphones being arranged at a corresponding control point of the plurality of control points and detecting error sound between the noise at the corresponding control point and the control sound at the corresponding control point, wherein
each of the control sound signal generating units generates the control sound signal based on the error sound detected by a predetermined error microphone of the plurality of error microphones, and
the noise reduction apparatus further comprises an input switching unit that, when a level of the noise at a predetermined position is higher than a predetermined threshold value, feeds an error audio signal at a predetermined control point of the plurality of control points or a control point that is newly set based on the plurality of control points into each of the control sound signal generating units, the number of the newly set control point being less than the number of the plurality of control points.

2. The noise reduction apparatus according to claim 1 further comprising
a noise detection unit that detects noise generated from a noise source.

3. The noise reduction apparatus according to claim 1, wherein
the error microphone detects noise generated from a noise source.

4. The noise reduction apparatus according to claim 2, wherein
the plurality of loudspeakers includes first and second loudspeakers,
the plurality of error microphones includes first and second error microphones arranged at first and second control points,
the plurality of control sound signal generating units includes first and second control sound signal generating units,
when a noise level detected by the noise detection unit is equal to or less than the predetermined threshold value, the input switching unit feeds an output of the first error microphone to the first control sound signal generating unit and feeds an output of the second error microphone to the second control sound signal generating unit, and
when the noise level detected by the noise detection unit is higher than the predetermined threshold value, the input switching unit selects any one of the two control points and feeds an output of an error microphone arranged at the selected control point among the first and second error microphones into both the first and second control sound signal generating units.

5. The noise reduction apparatus according to claim 2, wherein
the plurality of loudspeakers includes first and second loudspeakers,
the plurality of error microphones includes first and second error microphones arranged at first and second control points,
the plurality of control sound signal generating units includes first and second control sound signal generating units, and
the input switching unit further includes
an average processing circuit that averages outputs of the first and second error microphones and outputs the averaged output as an output at a virtual third control point newly set at approximately a center position between the first and second control points, and
when the noise level detected by the noise detection unit is equal to or less than the predetermined threshold value, the average processing circuit feeds an output of the first error microphone into the first control sound signal generating unit and feeds an output of the second error microphone into the second control sound signal generating unit, and
when the noise level detected by the noise detection unit is higher than the predetermined threshold value, the average processing circuit feeds an output of the average processing circuit into both the first and second control sound signal generating units.

6. The noise reduction apparatus according to claim 2, wherein
the plurality of loudspeakers includes first and second loudspeakers,
the plurality of error microphones includes first and second error microphones arranged at first and second control points,
the plurality of control sound signal generating units includes first and second control sound signal generating units, and
the input switching unit further includes
a third error microphone arranged at a third control point newly set at approximately a center position of a straight line connecting the first and second error microphones,
when the noise level detected by the noise detection unit is equal to or less than the predetermined threshold value, the input switching unit feeds an output of the first error microphone to the first control sound signal generating unit and feeds the output of the second error microphone to the second control sound signal generating unit, and
when the noise level detected by the noise detection unit is higher than the predetermined threshold value, the input switching unit feeds an output of the third error microphone into both the first and second control sound signal generating units.

7. The noise reduction apparatus according to claim 2, wherein the input switching unit changes the predetermined threshold value depending on a frequency of noise detected by the noise detection unit.

8. The noise reduction apparatus according to claim 7, wherein the input switching unit sets a smaller predetermined threshold value when the frequency of noise detected by the noise detection unit is lower.

* * * * *